US012772641B2

(12) United States Patent

Oka et al.

(10) Patent No.: US 12,772,641 B2
(45) Date of Patent: Oct. 20, 2026

(54) LIGHT-EMITTING DEVICE

(71) Applicant: NICHIA CORPORATION, Anan (JP)

(72) Inventors: Yuta Oka, Awa (JP); Yuma Nakamura, Anan (JP)

(73) Assignee: NICHIA CORPORATION, Anan (JP)

( * ) Notice: Subject to any disclaimer, the term of this patent is extended or adjusted under 35 U.S.C. 154(b) by 414 days.

(21) Appl. No.: 18/498,799

(22) Filed: Oct. 31, 2023

(65) Prior Publication Data

US 2024/0154080 A1 May 9, 2024

(30) Foreign Application Priority Data

Nov. 9, 2022 (JP) ................................ 2022-179773
Apr. 4, 2023 (JP) ................................ 2023-060645

(51) Int. Cl.
*H10H 20/857* (2025.01)
*H10H 20/813* (2025.01)
*H10H 29/14* (2025.01)

(52) U.S. Cl.
CPC ........ *H10H 20/857* (2025.01); *H10H 20/813* (2025.01); *H10H 29/142* (2025.01)

(58) Field of Classification Search
CPC .. H10H 20/857; H10H 20/813; H10H 29/142; H10H 20/851; H10H 20/882; H10W 90/00; G03B 15/05; G03B 15/02; H04N 23/56
See application file for complete search history.

(56) References Cited

U.S. PATENT DOCUMENTS

| | | | | |
|---|---|---|---|---|
| 2007/0085944 | A1 | 4/2007 | Tanaka et al. | |
| 2011/0291149 | A1 | 12/2011 | Sugizaki et al. | |
| 2015/0206922 | A1 | 7/2015 | Kawai et al. | |
| 2021/0083154 | A1* | 3/2021 | Maeda ................. | H10H 20/854 |
| 2022/0316683 | A1 | 10/2022 | Yoshida et al. | |
| 2023/0099993 | A1* | 3/2023 | Kim ....................... | H04N 23/90 348/135 |

FOREIGN PATENT DOCUMENTS

| | | | |
|---|---|---|---|
| JP | 2007-140453 | A | 6/2007 |
| JP | 2009-088374 | A | 4/2009 |
| JP | 2011-249501 | A | 12/2011 |
| JP | 2015-135908 | A | 7/2015 |
| JP | 2015-177021 | A | 10/2015 |
| JP | 2021-128951 | A | 9/2021 |
| JP | 2022-159981 | A | 10/2022 |

* cited by examiner

*Primary Examiner* — Karen Kusumakar
(74) *Attorney, Agent, or Firm* — Foley & Lardner LLP

(57) ABSTRACT

A light-emitting device includes: a light source including: a plurality of light-emitting parts, each having a first main surface serving as a light-exiting surface, and a second main surface on a side opposite the first main surface, and each comprising a first electrode and a second electrode at the second main surface, and a covering member integrally holding the plurality of light-emitting parts such that the first electrode and the second electrode are exposed from the covering member; and a substrate having an upper surface and comprising, at the upper surface: a plurality of first wiring portions, each of which is opposed to a corresponding one of the first electrodes of the light-emitting parts, and a plurality of second wiring portions, each of which is opposed to a corresponding one of the second electrodes of the light-emitting parts.

23 Claims, 16 Drawing Sheets

LIGHT-EMITTING DEVICE

CROSS-REFERENCE TO RELATED APPLICATIONS

The present application claims priority under 35 U.S.C. § 119 to Japanese Patent Application No. 2022-179773, filed Nov. 9, 2022, and Japanese Patent Application No. 2023-060645, filed Apr. 4, 2023. The entire contents of these applications are hereby incorporated by reference.

BACKGROUND

1. Technical Field

The present disclosure relates to a light-emitting device.

2. Description of Related Art

Light sources employing light-emitting elements such as light-emitting diodes are increasingly used in recent years. For example, Japanese Patent Publication No. 2015-135908, Japanese Patent Publication No. 2015-177021, and Japanese Patent Publication No. 2009-088374 disclose a light-emitting device including a plurality of light-emitting element adjacently arranged on a substrate.

SUMMARY

In a light-emitting device including a plurality of light-emitting elements, as the number of the light-emitting elements increases, or as the separation distance between adjacent light-emitting elements decreases, higher heat dissipation performance is demanded for heat accompanying emission of light by the light-emitting elements.

An object of the present disclosure is to provide a light-emitting device that offers high heat dissipation performance.

A light-emitting device according to the present disclosure includes: a light source including a plurality of light-emitting parts each having a first main surface serving as a light-exiting surface and a second main surface on a side opposite the first main surface and provided with a first electrode and a second electrode, and a covering member integrally holding the plurality of light-emitting parts and exposing the first electrode and the second electrode, the plurality of light-emitting parts being capable of being turned on individually or as a group and being arranged in a first direction and a second direction intersecting the first direction; and a substrate having an upper surface and including on the upper surface a plurality of first wiring portions each of which is opposed to a corresponding one of the first electrodes of the light-emitting parts and a plurality of second wiring portions each of which is opposed to a corresponding one of the second electrodes of the light-emitting parts. The plurality of light-emitting parts include at least one first light-emitting part disposed at a center area and at least one second light-emitting part disposed outside the first light-emitting part in a top view and have a first irradiation mode of being capable of causing only the at least one first light-emitting part to emit light at a predetermined output The first wiring portion connected to one of the at least one first light-emitting part is continuous through a first wiring connection portion with the first wiring portion connected to another one of the at least one first light-emitting part or the second light-emitting part adjacent to the one of the at least one first light-emitting part on the upper surface.

With the light-emitting device according to the present disclosure, improvement in the heat dissipation performance is possible.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION

Figure 1:
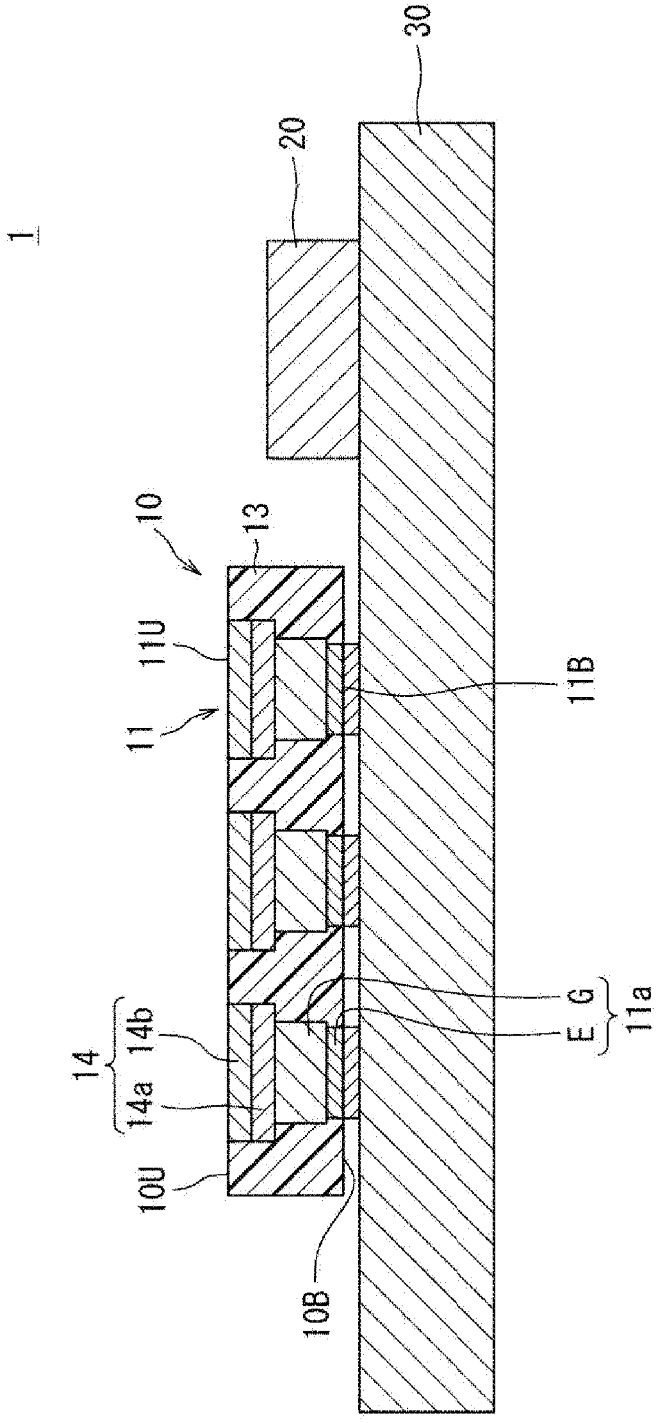
FIG. 1 is a schematic cross-sectional view of a light-emitting device according to one embodiment of the present disclosure.

Certain embodiments for carrying out the present disclosure will be described below with reference to the accompanying drawings. Light-emitting devices described below are intended to embody the technical idea of the present disclosure. The present disclosure is not limited to the embodiments below unless specifically stated otherwise.

In the drawings, members having the same function may be denoted by the same reference numeral. For convenience or ease of explanation or understanding of the main points, a plurality of embodiments may be described, but the configurations of different embodiments can be partially replaced or combined. In the subsequent embodiments, description of matters in common with the preceding embodiments may be omitted, and only different points may be described. In particular, similar actions and effects provided by similar configurations are not mentioned for every embodiment. The sizes, positional relationships, and the like of members shown in the drawings may be exaggerated for clarity of descriptions. In some cases, a cross-sectional end view showing only the cut surface of a member may be used for a cross-sectional view.

In the descriptions below, terms representing particular directions or positions (such as "up/upper," "down/lower," and other terms containing the meanings of these terms) may be used. These terms are used merely for representing relative directions or relative positions in the reference drawings. In the present specification, for example, supposing that there are two members, a positional relationship expressed as "on (or under)" includes the case in which the two members are in contact with each other and the case in which the two members are not in contact with each other and one of the members is located above (or below) the other member.

Light-Emitting Device According to First Embodiment

A light-emitting device 1 according to one embodiment of the present disclosure includes a light source 10 and a substrate 30 as shown in FIG. 1. The light-emitting device 1 may further include a controller 20. Each constituent member of the light-emitting device 1 will be described below in detail.

Light Source

The light source 10 includes a plurality of light-emitting parts 11 and a covering member 13 covering the light-emitting parts 11. On an upper surface 10U of the light source 10 illustrated in FIG. 1, a first main surface 11U, which is the light-exiting surface of each light-emitting part 11, is exposed from the covering member 13. On a lower surface 10B of the light source 10, electrodes E of each light-emitting part 11 are also exposed from the covering member 13. The lower surface 10B of the light source 10 serves as a mounting surface and is opposed to the upper surface of the substrate 30.

Light-Emitting Part

Figure 2A:
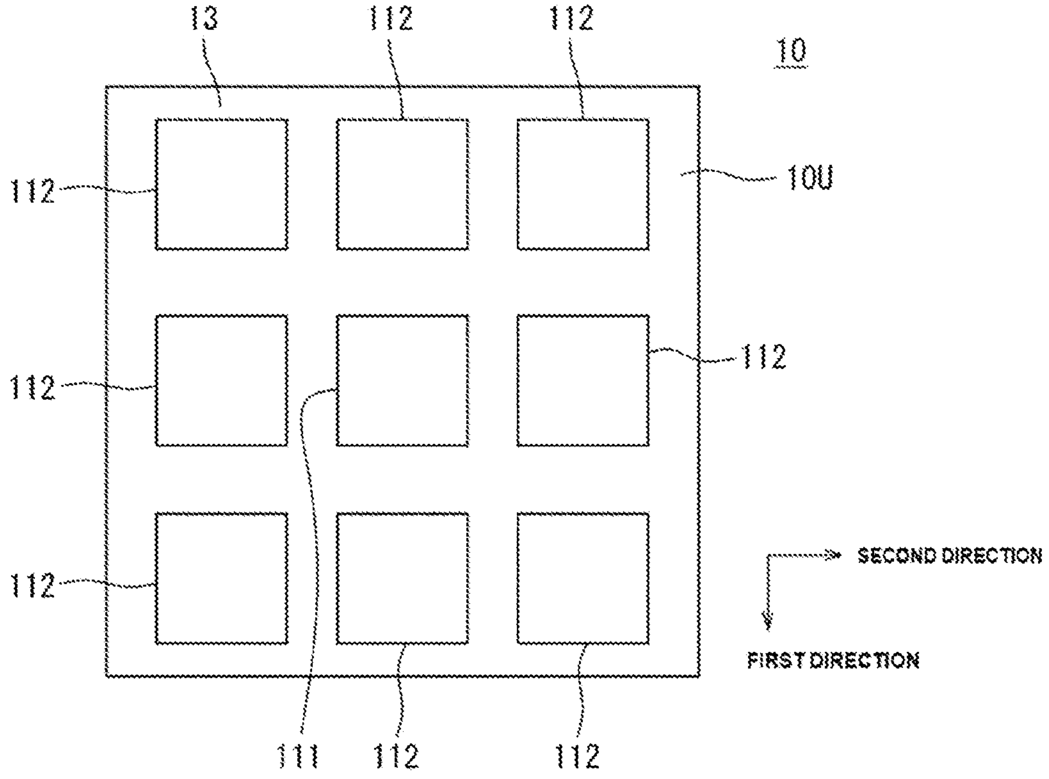
FIG. 2A is a schematic plan view of a light source according to the embodiment of the present disclosure.

For example, the light-emitting parts 11 can be turned on individually or as a group by the controller 20 described below. The light-emitting parts 11 are preferably aligned at regular intervals in a first direction (column direction) and a second direction (row direction) intersecting the first direction in a top view as shown in FIG. 2A. FIG. 2A illustrates a form in which a plurality of light-emitting parts 11 are aligned in three columns and three rows.

Figure 2B:
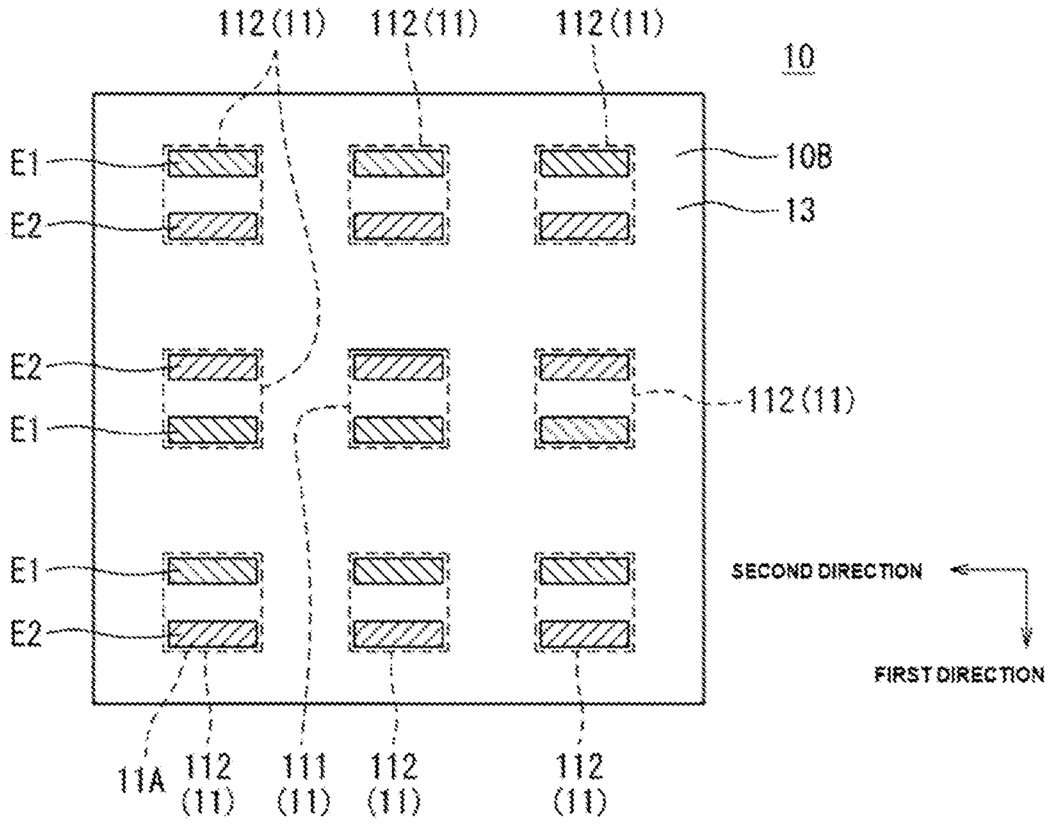
FIG. 2B is a schematic bottom view of the light source according to the embodiment of the present disclosure.
Figure 5A:
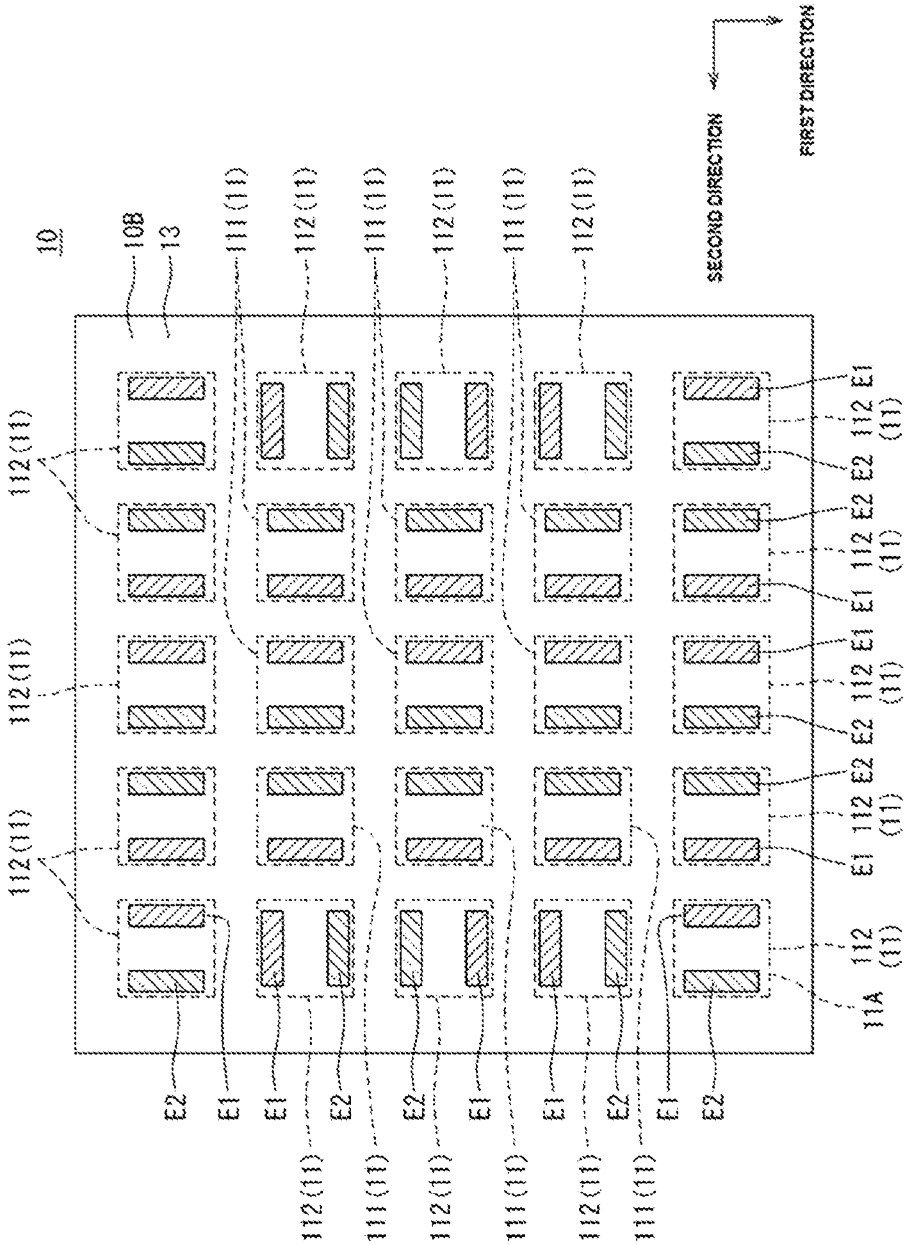
FIG. 5A is a schematic bottom view of a third modification of the light source according to the embodiment of the present disclosure.

The light-emitting parts 11 include at least one first light-emitting part 111 disposed at the center area and at least one second light-emitting part 112 disposed outside the first light-emitting part 111 in a top view. FIGS. 2A and 2B illustrate one first light-emitting part 111 and eight second light-emitting parts 112 arranged around the first light-emitting part 111. The numbers and arrangement of the first light-emitting parts 111 and the second light-emitting parts 112 are not limited to this example. For example, the light-emitting parts 11 may include nine first light-emitting parts 111 and 16 second light-emitting parts 112 arranged around the first light-emitting parts 111 as shown in FIG. 5A and other drawings.

The light-emitting parts 11 may be turned on individually or may be turned on as a group by the controller 20. By turning on the light-emitting parts 11 individually or as a group, light can be applied to a desired region to be illuminated. By turning on each light-emitting part 11 at a desired brightness, the contrast in the region to be illuminated by the light source 10 can be improved.

For example, the light-emitting device 1 according to the present embodiment can be used as a light source for a flash lamp of an imaging device. For example, the imaging device is installed in a mobile communication terminal. In the case in which the light-emitting device 1 according to the present embodiment is used as a light source for a flash lamp of an imaging device, for example, irradiation of light can be switched between a wide-angle shooting mode (second irradiation mode) in which all of the light-emitting parts 11 emit light and a telephoto mode (first irradiation mode) in which only the first light-emitting part 111 located near the center area emits light and the second light-emitting parts 112 located on the outer side do not emit light. The illumination angle of light of a light source for a flash lamp is narrower in the telephoto mode than in the wide-angle shooting mode. As the light-emitting device 1 is switchable between illumination beams corresponding to the wide-angle shooting mode and the telephoto mode, for example, photographing corresponding to shooting modes such as close-up and telephoto modes of an imaging device can be performed.

The distance between adjacent light-emitting parts 11 is preferably small in a top view. The distance between adjacent light-emitting parts 11 is, for example, 0.01 times or more and 0.16 times or less, preferably 0.02 times or more and 0.08 times or less, with respect to the maximum length of the light-emitting parts 11. The distance between adjacent light-emitting parts 11 is, for example, 10 μm or more and 200 μm or less, preferably 20 μm or more and 100 μm or less. By setting the distance between adjacent light-emitting parts 11 to the above range, a region that will be a dark portion between light-emitting parts 11 that simultaneously emit light can be reduced.

The light-emitting part 11 includes a light-emitting element 11*a*. The light-emitting part 11 may further include a light-transmissive member 14 disposed over the light-emitting element 11*a*. For example, the light-transmissive member 14 may be a plate-shaped member having a substantially rectangular shape in a top view and is disposed to cover the upper surface of the light-emitting element 11*a*. For example, the light-transmissive member 14 includes at least one selected from the group consisting of a wavelength conversion layer containing a wavelength conversion substance, a light-diffusing layer containing a light-diffusing substance, and a transparent layer not containing a wavelength conversion substance or a light-diffusing substance. For example, the light-transmissive member 14 includes a wavelength conversion layer 14*a* and a light-diffusing layer 14*b*.

The light-emitting element 11*a* includes a semiconductor structure body G and the electrodes E including a first electrode E1 and a second electrode E2. Each of the first electrode E1 and the second electrode E2 functions as an anode electrode or a cathode electrode. That is, either the first electrode E1 or the second electrode E2 is an anode electrode, and the other one is a cathode electrode. In the light-emitting element 11*a* shown in FIG. 1, the electrodes E are disposed below the semiconductor structure body G.

FIG. 2B is a schematic bottom view of the light source 10 as seen from the lower surface side, in which the first electrode E1 and the second electrode E2 of each light-emitting part 11 are exposed from the covering member 13. In FIG. 2B, the first electrodes E1 are indicated by hatching that slopes to the right, and the second electrodes E2 are indicated by hatching that slopes to the left. The first electrode E1 and the second electrode E2 of one light-emitting part 11 are adjacent to each other. The first electrodes E1 and the second electrodes E2 of all the light-emitting parts 11 have a rectangular shape extending in the second direction in a top view. Regarding light-emitting parts 11 adjacent to each other in the first direction, the first electrode E1 or the second electrode E2 of one light-emitting part 11 is adjacent to the electrode of the same kind of the other light-emitting part 11 in the first direction. Regarding light-emitting parts 11 adjacent to each other in the second direction, the first electrode E1 or the second electrode E2 of one light-emitting part 11 is adjacent to the electrode of the same kind of the other light-emitting part 11 in the second direction. For example, in a light-emitting part 11A located at the lower left corner among the nine light-emitting parts 11 arranged, the first electrode E1 and the second electrode E2 are adjacent to each other in the first direction. The first electrode E1 of the light-emitting part 11A is adjacent to the first electrode E1 of a light-emitting part 11 adjacent in the first direction in a top view. The first electrode E1 and the second electrode E2 of the light-emitting part 11A are adjacent to the first electrode E1 and the second electrode E2 of light-emitting parts 11 adjacent in the second direction in a top view.

In the light source 10 shown in FIG. 2B, the first electrodes E1 and the second electrodes E2 of the respective light-emitting parts 11 have substantially the same size. This form does not limit the light-emitting device of the present disclosure. For example, the size of the first electrode E1 and the size of the second electrode E2 of one light-emitting part 11 may be different. The first electrodes E1 and the second electrodes E2 of the light-emitting parts 11 may have different sizes. For example, the sizes of the first electrode E1 and the second electrode E2 of the first light-emitting part 111 may be different from the sizes of the first electrode E1 and the second electrode E2 of the second light-emitting part 112.

When the light source 10 is disposed on the substrate 30 described below, the electrodes E exposed on the lower surface of the light source 10 are opposed to wiring portions H of the substrate 30.

The semiconductor structure body G may include a supporting substrate and a semiconductor layer disposed on the supporting substrate. In this case, the supporting substrate, the semiconductor layer, and the electrodes E are disposed in this order. The semiconductor structure body G includes an n-side semiconductor layer, a p-side semiconductor layer, and an active layer interposed between the n-side semiconductor layer and the p-side semiconductor layer. The active layer may have a single quantum well (SQW) structure or a multiple quantum well (MQW) structure including a plurality of well layers. The semiconductor structure body G includes a plurality of semiconductor layers made of a nitride semiconductor. The nitride semiconductor includes all semiconductors having compositions represented by the chemical formula $In_xAl_yGa_{1-x-y}N$ ($0 \leq x$, $0 \leq y$, and $x+y \leq 1$) with composition ratios x and y varying over the respective ranges. The peak emission wavelength of the active layer can be appropriately selected according to the purpose. For example, the active layer is configured to be capable of emitting visible light or ultraviolet light.

The semiconductor structure body G may include a plurality of light-emitting structure bodies each including an n-side semiconductor layer, an active layer, and a p-side semiconductor layer. In the case in which the semiconductor structure body G includes a plurality of light-emitting structure bodies, the respective light-emitting structure bodies may include well layers having different peak emission wavelengths or may include well layers having the same peak emission wavelength. The expression of "the same peak emission wavelength" includes the case in which there are variations of approximately several nanometers. The combination of the peak emission wavelengths of the light-emitting structure bodies can be appropriately selected. For example, in the case in which the semiconductor structure body G includes two light-emitting structure bodies, examples of the combination of light beams emitted by the respective light-emitting structure bodies include blue light and blue light, green light and green light, red light and red light, ultraviolet light and ultraviolet light, blue light and green light, blue light and red light, and green light and red light. For example, in the case in which the semiconductor structure body G includes three light-emitting structure bodies, examples of the combination of light beams emitted by the respective light-emitting structure bodies include blue light, green light, and red light. Each light-emitting structure body may include one or more well layers having a peak emission wavelength different from the peak emission wavelength of the other well layers.

The wavelength conversion layer 14*a* converts the wavelength of at least a part of light emitted from the light-emitting element 11*a*. The wavelength conversion layer 14*a* may be a plate-shaped member having a substantially rectangular shape in a top view. Examples of the wavelength conversion substance contained in the wavelength conversion layer 14*a* include yttrium-aluminum-garnet-based phosphors (such as $(Y,Gd)_3(Al,Ga)_5O_{12}$:Ce), lutetium-aluminum-garnet-based phosphors (such as $Lu_3(Al,Ga)_5O_{12}$:Ce), terbium-aluminum-garnet-based phosphors (such as $Tb_3(Al,Ga)_5O_{12}$:Ce), CCA-based phosphors (such as $Ca_{10}(PO_4)_6Cl_2$:Eu), SAE-based phosphors (such as $Sr_4Al_{14}O_{25}$:Eu), chlorosilicate-based phosphors (such as $Ca_8MgSi_4O_{16}Cl_2$:Eu), silicate-based phosphors (such as $(Ba,Sr,Ca,Mg)_2SiO_4$:Eu), oxynitride-based phosphors such as β-SiAlON phosphors (such as $(Si,Al)_3(P,N)_4$:Eu) and α-SiAlON phosphors (such as $Ca(Si,Al)_{12}(O,N)_{16}$:Eu), nitride-based phosphors such as LSN-based phosphors (such as $(La,Y)_3Si_6N_{11}$:Ce), BSESN-based phosphors (such as $(Ba,Sr)_2Si_5N_8$:Eu), SLA-based phosphors (such as $SrLiAl_3N_4$:Eu), CASN-based phosphors (such as $CaAlSiN_3$:Eu), and SCASN-based phosphors (such as $(Sr,Ca)AlSiN_3$:Eu), fluoride-based phosphors such as KSF-based phosphors (such as $K_2SiF_6$:Mn), KSAF-based phosphors (such as $K_2(Si_{1-x}Al_x)F_{6-x}$:Mn, where x satisfies $0<x<1$), and MGF-based phosphors (such as $3.5MgO \cdot 0.5MgF_2 \cdot GeO_2$:Mn), quantum dots having a perovskite structure (such as $(Cs,FA,MA)(Pb,Sn)(F,Cl,Br,I)_3$, where FA and MA respectively represent formamidinium and methylammonium), Group II-VI quantum dots (such as CdSe), Group III-V quantum dots (such as InP), and quantum dots having a chalcopyrite structure (such as $(Ag,Cu)(In,Ga)(S,Se)_2$).

Examples of the wavelength conversion layer 14*a* include a mixture of a resin material, a ceramic, glass, or the like and the above wavelength conversion substance, and a sintered body of the wavelength conversion substance. Alternatively, the wavelength conversion layer 14*a* may be a member in which a resin layer containing the wavelength conversion substance is disposed on one surface of a molded body made of a resin material, a ceramic, glass, or the like.

In the case in which white light is emitted from a plurality of light-emitting parts 11, for example, a light-emitting element 11*a* that emits blue light and a wavelength conversion layer 14*a* containing a wavelength conversion substance that emits yellow light by the light emitted from the light-emitting element 11*a* can be combined.

The light-diffusing layer 14*b* diffuses light entering the light-diffusing layer 14*b*. The light-diffusing layer 14*b* may be a plate-shaped member having a substantially rectangular shape in a top view. The light-diffusing layer 14*b* is disposed to cover the upper surface of the wavelength conversion layer 14*a*. For example, a resin material containing a light-diffusing substance such as titanium oxide, barium titanate, aluminum oxide, silicon oxide, or the like can be used for the light-diffusing layer 14*b*. The planar shape of the light-diffusing layer 14*b* of the present embodiment is the same as the planar shape of the wavelength conversion layer 14*a*. The planar shape of the light-diffusing layer 14*b* may be larger or smaller than the planar shape of the wavelength conversion layer 14*a*.

The outer periphery of the light-transmissive member 14 may correspond to the outer periphery of the light-emitting element 11*a* or may be located outward of the outer periphery of the light-emitting element 11*a* in a top view. This structure can reduce extraction of light emitted from the light-emitting element 11*a* to the outside without passing through the light-transmissive member 14. The outer periphery of the light-transmissive member 14 may be located inward of the outer periphery of the light-emitting element 11*a* in a top view.

Covering Member

For example, the covering member 13 has light reflecting properties and reflects light emitted from the light-emitting parts 11, or has light absorbing properties and absorbs light emitted from the light-emitting parts 11. The covering member 13 integrally holds a plurality of light-emitting parts 11 and exposes the first electrodes E1 and the second electrodes E2. Specifically, the covering member 13 exposes the first main surface 11U, which is the light-exiting surface of each light-emitting part 11, at the upper surface 10U of the light source 10 and exposes the first electrode E1 and the second electrode E2 at a second main surface 11B (lower surface) of the light-emitting part 11 at the lower surface 10B of the light source 10 and covers lateral surfaces of the light-emitting parts 11. The covering member 13 is disposed between adjacent light-emitting parts 11. Specifically, the covering member 13 is disposed between adjacent light-emitting elements 11*a* and between adjacent light-transmissive members 14. By disposing the covering member 13 between adjacent light-emitting elements 11*a* and between adjacent light-transmissive members 14, for example, in the case in which one of the light-emitting parts 11 emits light and the adjacent light-emitting part 11 does not emit light, light emitted from the one light-emitting part can be hindered from entering the light-transmissive member 14 of the adjacent light-emitting part 11, so that the wavelength conversion substance contained in the light-transmissive member 14 can be unlikely to emit light. Accordingly, a light-emitting device having a high contrast can be provided.

In the light-emitting device 1 according to the present embodiment, the covering member 13 covers lateral surfaces of the light-emitting elements 11*a*, lateral surfaces of the wavelength conversion layers 14*a*, and lateral surfaces of the light-diffusing layers 14*b*. On the first main surface 11U of the light-emitting part 11, the upper surface of the light-diffusing layer 14*b* is exposed from the covering member 13. The first main surface 11U is a main light extracting surface. The covering member 13 also covers lateral surfaces of the semiconductor structure bodies G of the light-emitting elements 11*a*, lower surfaces of the semiconductor structure bodies G, and lateral surfaces of the electrodes E.

The distance (the width of the covering member 13) between adjacent light-emitting parts 11 is, for example, 0.01 times or more and 0.16 times or less, preferably 0.02 times or more and 0.08 times or less, with respect to the maximum length of the first main surface 11U of the light-emitting part 11 in a top view. The distance between adjacent light-emitting parts 11 is, for example, 10 μm or more and 200 μm or less, preferably 20 μm or more and 100 μm or less. This structure can provide a light-emitting module having a high contrast while miniaturizing the light-emitting device 1 in a top view.

For example, a resin material containing a light-reflective substance such as a white pigment can be used for the covering member 13. Examples of the light-reflective substance include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and silicon oxide, and one of these substances can be used singly, or two or more of these can be used in combination. In the case in which the covering member 13 has light-absorbing properties, the covering member 13 can contain a light-absorbing material such as carbon black. For the resin material, a resin material mainly composed of a thermosetting resin such as an epoxy resin, a silicone resin, a modified silicone resin, and a phenolic resin or a resin material mainly composed of a thermoplastic resin such as a polyphthalamide resin, polybutylene terephthalate, and an unsaturated polyester is preferably used as the base material.

Substrate

The substrate 30 is a member on which a plurality of light-emitting parts 11 can be disposed. Specifically, the first light-emitting part 111 can be disposed at the center area of the substrate 30, and the second light-emitting parts 112 can be disposed to surround the first light-emitting part 111. For example, the substrate 30 includes a base material containing an insulating material and the wiring portions disposed on a surface of the base material. The substrate 30 may be further provided with a part of wiring inside the base material. The wiring portions disposed on the surface of the base material are electrically connected to the wiring portions disposed inside the base material, for example, through vias.

The substrate 30 has an upper surface 30U, and the wiring portions H are disposed on the upper surface 30U. On the upper surface 30U, the wiring portions H include a plurality of first wiring portions H1 opposed to the first electrodes E1 of the light-emitting parts 11, a plurality of second wiring portions H2 opposed to the second electrodes E2 of the light-emitting parts 11, and first wiring connection portions HS1 connecting first wiring portions H1 to each other.

Figure 2C:
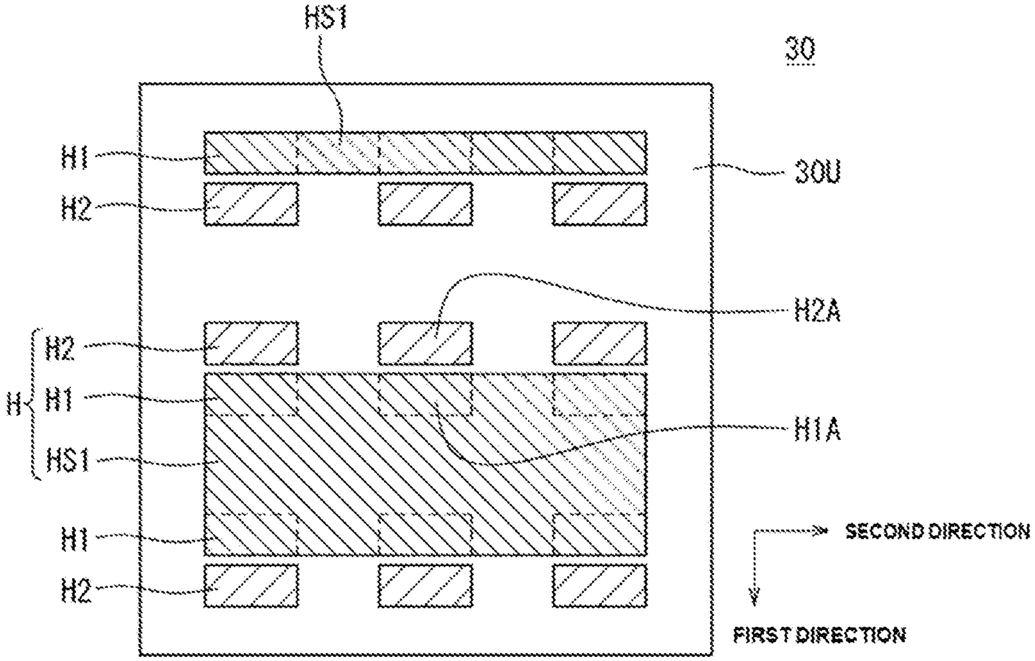
FIG. 2C is a schematic plan view of a substrate according to the embodiment of the present disclosure.

FIG. 2C schematically shows an example of the wiring portions H of the substrate 30. The wiring portions H include a plurality of first wiring portions H1 and a plurality of second wiring portions H2. The first wiring portions H1 are wiring portions connected to the first electrodes E1 of the light-emitting parts 11, and the second wiring portions H2 are wiring portions connected to the second electrodes E2 of the light-emitting parts 11. The substrate 30 includes a first wiring portion H1A and a second wiring portion H2A connected to the first light-emitting part 111 disposed at the center area. On the upper surface 30U, the first wiring portion H1A connected to the first light-emitting part 111 is continuous through the first wiring connection portion HS1 with first wiring portions H1 connected to second light-emitting parts 112 adjacent to the first light-emitting part 111. With this structure, heat accompanying emission of light by the first light-emitting part 111 disposed at the center area can be dissipated not only through the first wiring portion H1A but also through the adjacent first wiring portions H1 through the first wiring connection portion HS1. It is hard for heat to be dissipated to the outside from the first light-emitting part 111 disposed at the center area among the light-emitting parts 11 integrally held by the covering member 13, and there is a possibility that the heat dissipation performance is impaired. Accordingly, the heat dissipation performance of heat emitted from the first light-emitting part 111 can be improved by connecting the first wiring portion H1A connected to the first light-emitting part 111 to the adjacent first wiring portions H1 through the first wiring connection portion HS1. For example, in the case in which the light-emitting device 1 is used as a light source for a flash lamp of an imaging device, there is a case in which light is applied in the telephoto mode (first irradiation mode) in which only the first light-emitting part 111 located near the center area emits light and the second light-emitting parts 112 located on the outer side do not emit light. In other words, in the first irradiation mode, only the first light-emitting part 111 emits light at a predetermined output. In the telephoto mode (first irradiation mode), light at a certain illuminance is required to be provided by the first light-emitting part 111 alone, and there is a possibility that the current value applied to the first light-emitting part 111 increases. Even in such a case, the above configuration allows heat generated from the first light-emitting part 111 to be further dissipated to the adjacent wiring portions, and the heat dissipation performance of heat generated from the first light-emitting part 111 can be improved.

On the upper surface 30U, adjacent first wiring portions H1 among the first wiring portions H1 may be continuous with one another through a first wiring connection portion HS1 in addition to the first wiring portion H1A located near the center area. As for the wiring portions H shown in FIG. 2C, the three first wiring portions H1 connected to the second light-emitting parts 112 located in the first row are continuous with one another through a first wiring connection portion HS1 in the second direction. All of the first wiring portions H1 of the first light-emitting part 111 and the second light-emitting parts 112 located in the second row and the third row are disposed so as to be continuous with one another through the first wiring connection portion HS1. The first wiring portions H1 and the first wiring connection portions HS1 continuously disposed function as common wiring of the light-emitting device 1.

On the other hand, the second wiring portions H2 are independent of one another and function as individual wiring of the light-emitting device 1. The independence of the second wiring portions H2 from one another allows for individual control by independently supplying electricity to each light-emitting part 11.

In a suitable form of the present embodiment, on the upper surface 30U, the first wiring portion H1A connected to the first light-emitting part 111 may be continuous with first wiring portions H1 connected to two or more second light-emitting parts 112 adjacent to the first light-emitting part 111 through the first wiring connection portion HS1. The first wiring portion H1A shown in FIG. 2C is continuous through the first wiring connection portion HS1 with three first wiring portions H1 including the first wiring portion H1 connected to one second light-emitting part 112 adjacent to the first light-emitting part 111 in the first direction and the first wiring portions H1 connected to two second light-emitting parts 112 adjacent to the first light-emitting part 111 in the second direction. With such a configuration, heat accompanying emission of light by the first light-emitting part 111 disposed at the center area can be dissipated not only through the first wiring portion H1A but also through the first wiring portions H1 continuous through the first wiring connection portion HS1.

Connecting members B (such as solder) are used for the electrical connection between the substrate 30 and the light source 10. Specifically, the first electrodes E1 of the light-emitting parts 11 are electrically connected to the first wiring portions H1 and the first wiring connection portions HS1 of the substrate 30, and the second electrodes E2 of the light-emitting parts 11 are electrically connected to the second wiring portions H2 of the substrate 30.

Figure 2D:
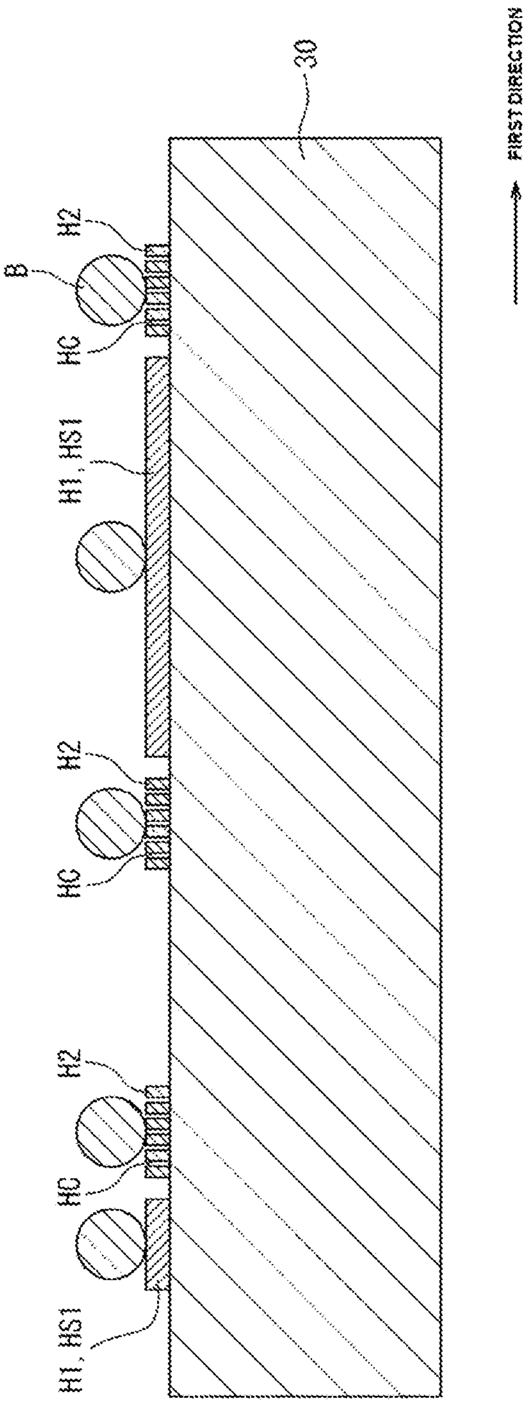
FIG. 2D is a schematic cross-sectional view of the substrate according to the embodiment of the present disclosure.
Figure 2E:
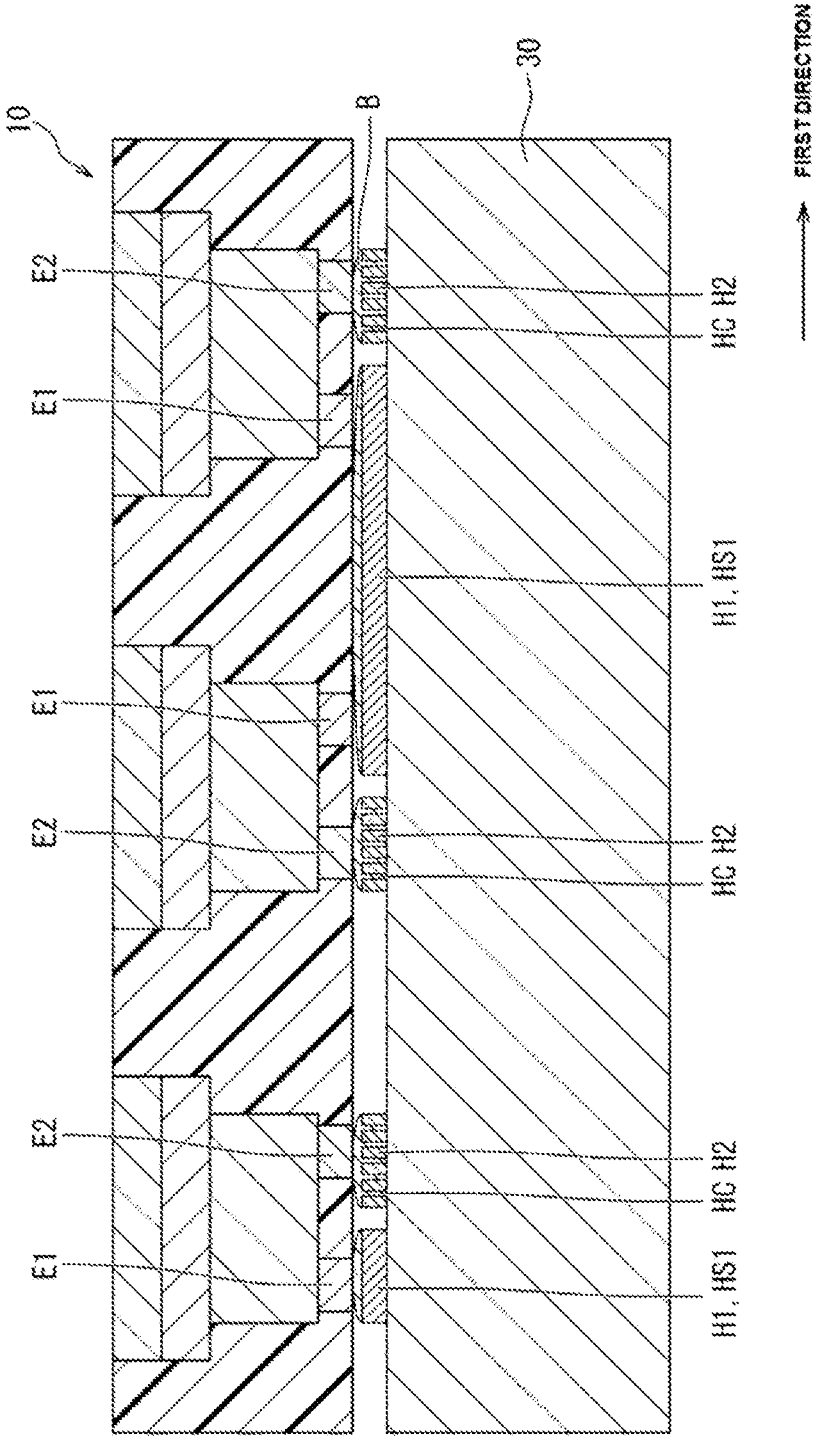
FIG. 2E is a schematic cross-sectional view of the light source mounted on the substrate according to the embodiment of the present disclosure.

As in the example shown in FIG. 2D, the connecting members B are disposed by supplying a predetermined amount of the connecting member B on each of the first wiring portions H1, the first wiring connection portions HS1, and the second wiring portions H2 using a connecting member feeder (such as a dispenser). In a plan view shown in FIG. 2C, the area of the second wiring portion H2 is smaller than the areas of the first wiring portion H1 and the first wiring connection portion HS1, and the ratio of the connecting member B per area of the second wiring portion H2 is therefore higher than the ratio of the connecting member B per area of each of the first wiring portion H1 and the first wiring connection portion HS1. Accordingly, as a suitable form of the second wiring portion H2, the second wiring portion H2 may have an accommodating portion HC that accommodates the connecting member B. For example, the accommodating portion HC may be slits formed in the second wiring portion H2 as shown in FIG. 2D and FIG. 2E. FIG. 2D and FIG. 2E schematically show a form in which slits are formed to extend perpendicularly to the first direction in a plan view, but this form is not limiting. Slits may be formed to extend obliquely (or parallel) with respect to the first direction in a plan view. The shape of the accommodating portion HC is not limited to a slit, but rather may be a hole. By providing the accommodating portion HC that accommodates the connecting member B in the wiring portion (second wiring portion H2) having a comparatively small area as described above, the surplus of the connecting member B can be accommodated in the accommodating portion HC, and, for example, a case in which the light source 10 is disposed in an inclined position on the substrate 30 can be reduced.

Controller

The controller 20 is disposed on the substrate 30 and can control a plurality of light-emitting parts 11 individually or as a group. With the controller 20 that controls the light-emitting parts 11 individually or as a group, in the case in which the light-emitting device 1 is used as a light source for a flash lamp of an imaging device, control of switching can be performed between the wide-angle shooting mode (second irradiation mode) in which all of the light-emitting parts 11 emit light and the telephoto mode (first irradiation mode) in which only the first light-emitting part 111 located near the center area emits light and the second light-emitting parts 112 located on the outer side do not emit light.

Described above is an example in which the light-emitting device 1 of the present disclosure is used for a light source for a flash lamp of an imaging device, in which the first irradiation mode corresponds to the telephoto mode and the second irradiation mode corresponds to the wide-angle shooting mode. The light-emitting device of the present disclosure can be used, for example, as a light source for lighting or a light source for a vehicle in addition to a light source for a flash lamp of an imaging device. In this case, the first irradiation mode and the second irradiation mode can correspond to various irradiation modes according to the intended use.

First Modification of Light-emitting Device

Figure 3A:
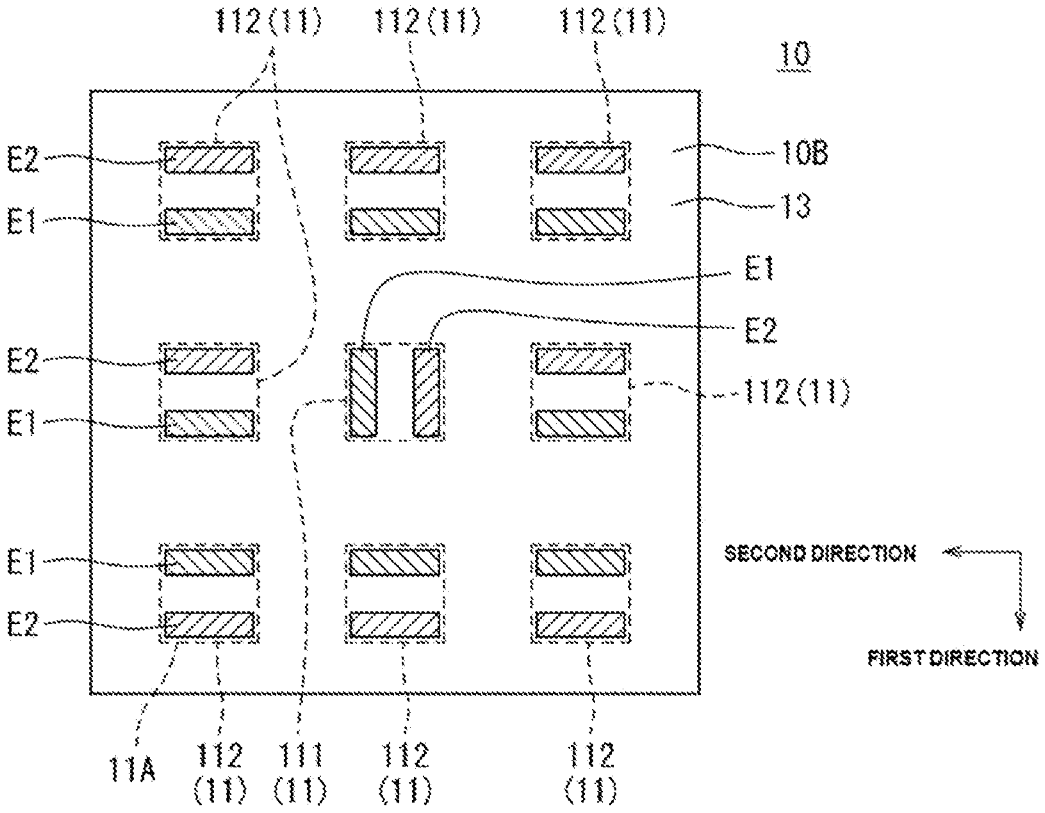
FIG. 3A is a schematic bottom view of a first modification of the light source according to the embodiment of the present disclosure.
Figure 3B:
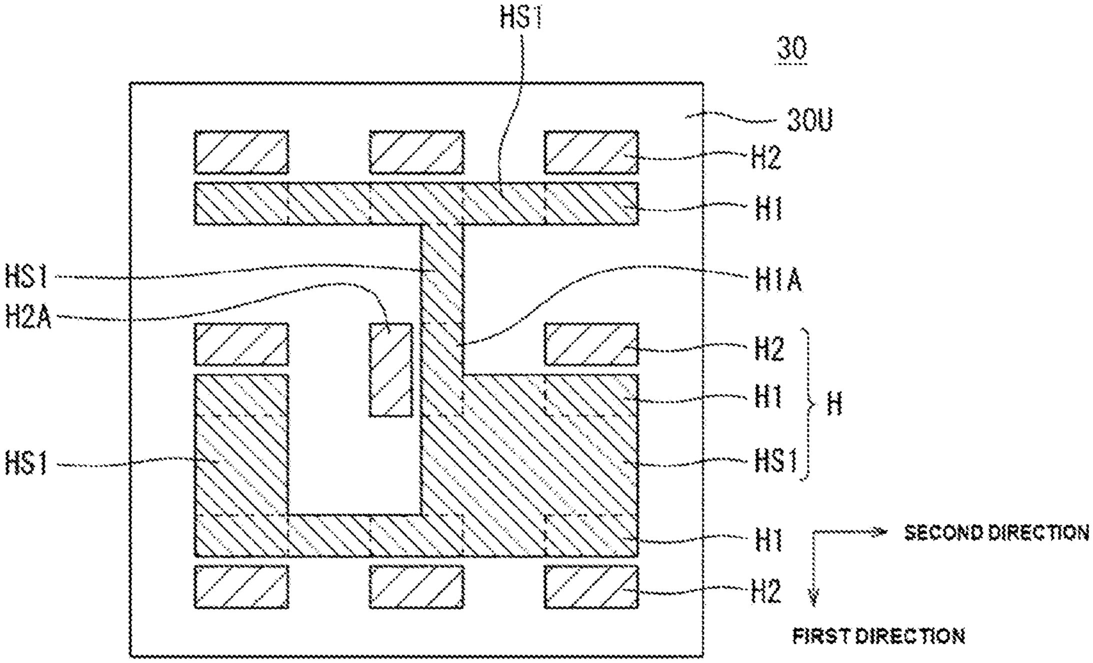
FIG. 3B is a schematic plan view of a first modification of the substrate according to the embodiment of the present disclosure.

Subsequently, a first modification of the light-emitting device according to the present disclosure will be described referring to FIGS. 3A and 3B. In the present modification, the arrangement of the first electrodes E1 and the second electrodes E2 of the light-emitting parts 11 and the shapes of the wiring portions H on the substrate 30 are different from the arrangement and the shapes in the light-emitting device according to the first embodiment described above. The following mainly describes differences from the light-emitting device described as the first embodiment.

Light-Emitting Part

A plurality of light-emitting parts 11 include one first light-emitting part 111 at the center area and eight second light-emitting parts 112 outside the first light-emitting part 111. In the present modification, the first electrode E1 and the second electrode E2 of the first light-emitting part 111 have a rectangular shape extending in the first direction in a top view. On the other hand, the first electrodes E1 and the second electrodes E2 of the second light-emitting parts 112 have a rectangular shape extending in the second direction.

In the present modification, each of the first electrodes E1 connected to the light-emitting parts 11 located in the first row and the third row is disposed closely to a corresponding one of the light-emitting parts 11 in the second row in the first direction in a top view. Each of the first electrodes E1 of the second light-emitting parts 112 located on the outer side among the light-emitting parts 11 located in the second row is disposed closely to a corresponding one of the light-emitting parts 11 in the third row in the first direction in a top view.

Substrate

The substrate 30 includes first wiring portions H1 and second wiring portions H2 on the upper surface 30U. The first wiring portions H1 are electrically connected to the first electrodes E1 of the light-emitting parts 11, and the second wiring portions H2 are electrically connected to the second electrodes E2 of the light-emitting parts 11.

In the present modification, all of the first wiring portions H1 are continuous with one another through a first wiring connection portion HS1 in a top view. This structure allows heat generated from each light-emitting part 11 to be dissipated through all the first wiring portions H1 continuous through the first wiring connection portion HS1. A light-emitting device that offers good heat dissipation performance can thus be provided. The first wiring portion H1A connected to the first light-emitting part 111 is continuous through the first wiring connection portion HS1 with three first wiring portions H1 including the first wiring portions H1 connected to two second light-emitting parts 112 adjacent in the first direction and the first wiring portion H1 connected to one second light-emitting part 112 adjacent in the second direction. This structure allows heat generated from the first light-emitting part 111 to be dissipated through all the first wiring portions H1 continuous through the first wiring connection portion HS1.

Second Modification of Light-Emitting Device

Figure 4A:
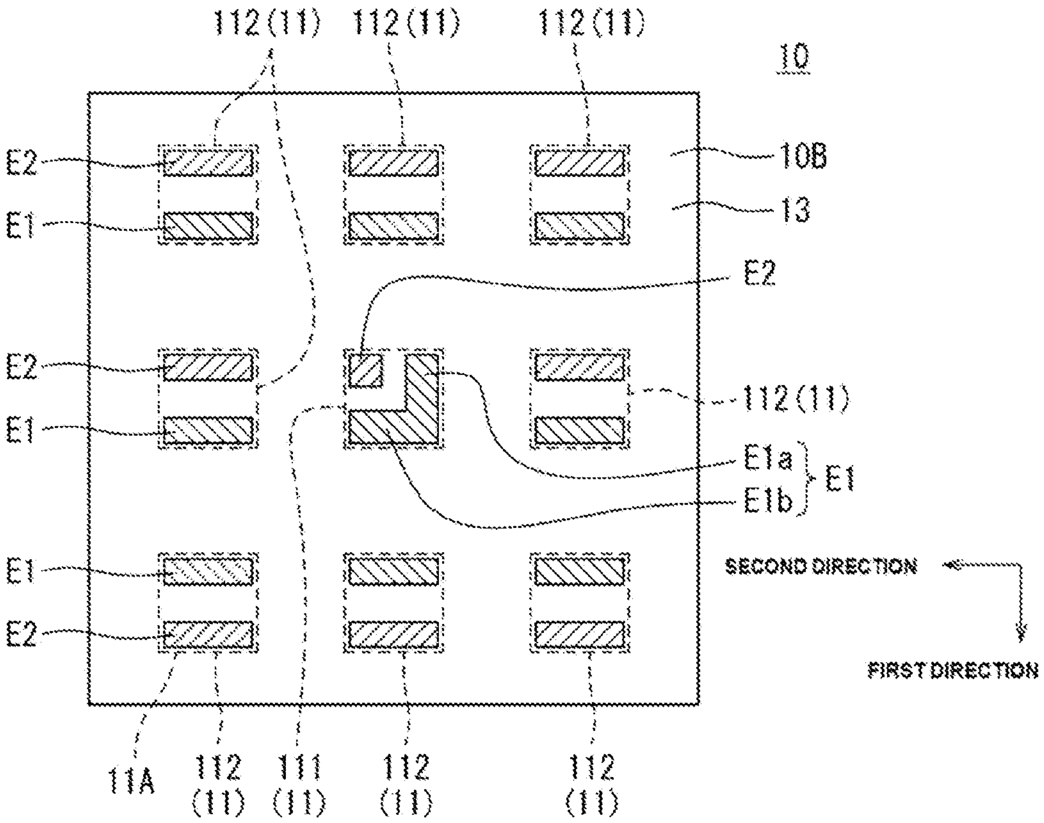
FIG. 4A is a schematic bottom view of a second modification of the light source according to the embodiment of the present disclosure.

Subsequently, a second modification of the light-emitting device according to the present disclosure will be described referring to FIGS. 4A and 4B. In the present modification, the arrangement of the first electrodes E1 and the second electrodes E2 of the light-emitting parts 11 and the shapes of the wiring portions H on the substrate 30 are different from the arrangement and the shapes in the light-emitting device according to the first embodiment described above. The following mainly describes differences from the light-emitting device described as the first embodiment.

Light-Emitting Part

A plurality of light-emitting parts 11 include one first light-emitting part 111 at the center area and eight second light-emitting parts 112 outside the first light-emitting part 111. In the present modification, the first electrodes E1 and the second electrodes E2 of the second light-emitting parts 112 have a rectangular shape extending in the second direction. On the other hand, the first electrode E1 of the first light-emitting part 111 includes a first portion E1*a* extending in the first direction and a second portion E1*b* continuous with the first portion E1*a* and extending in the second direction. The second electrode E2 of the first light-emitting part 111 has a rectangular shape and is disposed at a corner of the first light-emitting part 111 in a top view.

In the present modification, each of the first electrodes E1 connected to the light-emitting parts 11 located in the first row and the third row is disposed closely to a corresponding one of the light-emitting parts 11 in the second row in the first direction in a top view. Each of the first electrodes E1 of the second light-emitting parts 112 located on the outer side among the light-emitting parts 11 located in the second row is disposed closely to a corresponding one of the light-emitting parts 11 in the third row in the first direction in a top view.

Substrate

Figure 4B:
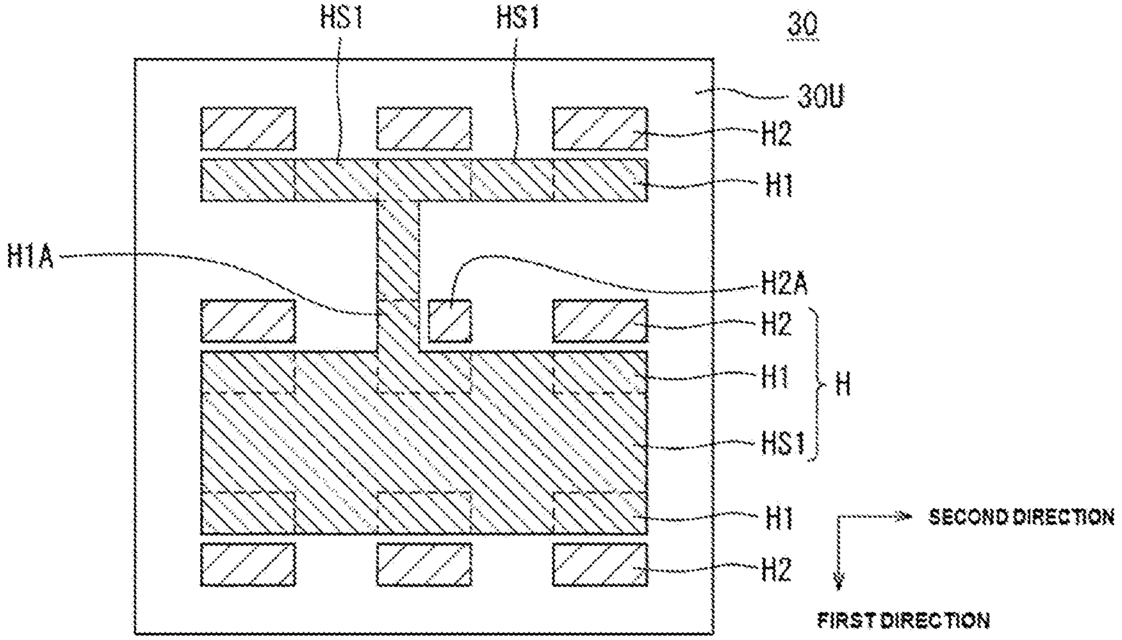
FIG. 4B is a schematic plan view of a second modification of the substrate according to the embodiment of the present disclosure.

The substrate 30 includes first wiring portions H1 and second wiring portions H2 on the upper surface 30U as shown in FIG. 4B. In the present modification, all of the first wiring portions H1 are continuous with one another through a first wiring connection portion HS1 in a top view. This structure allows heat generated from each light-emitting part 11 to be dissipated through all the first wiring portions H1 continuous through the first wiring connection portion HS1. A light-emitting device that offers good heat dissipation performance can thus be provided. The first wiring portion H1A connected to the first light-emitting part 111 is continuous through the first wiring connection portion HS1 with four first wiring portions H1 including the first wiring portions H1 connected to two second light-emitting parts adjacent in the first direction and the first wiring portions H1 connected to two second light-emitting parts adjacent in the second direction. This structure allows heat generated from the first light-emitting part 111 to be dissipated through all the first wiring portions H1 continuous through the first wiring connection portion HS1. With the wiring portions H of the present modification, wiring portions including the first wiring portions H1 connected to the light-emitting parts 11 located in the second row and the third row and the first wiring connection portion HS1 connecting the first wiring portions H1 have rectangular shapes having certain widths. In other words, the wiring portions do not include narrow parts as compared with, for example, the wiring portions H in the corresponding regions in the second modification. In this structure, when heat is transmitted to those regions, the heat is easily diffused over the entireties of the wiring portions because the heat dissipation paths do not include narrow parts. The heat dissipation performance can therefore be further improved using the wiring portions H of the present modification as compared with, for example, the wiring portions H in the first modification.

Third Modification of Light-Emitting Device

Subsequently, a third modification of the light-emitting device according to the present disclosure will be described referring to FIGS. 5A to 5C. The following mainly describes differences from the light-emitting devices described as the embodiment and the modifications.

Light-Emitting Part

In the present modification, the light-emitting parts 11 include nine first light-emitting parts 111 at the center area and 16 second light-emitting parts 112 outside the first light-emitting parts 111 as shown in FIG. 5A. In FIG. 5A, the first electrodes E1 are indicated by hatching that slopes to the right, and the second electrodes E2 are indicated by hatching that slopes to the left.

The first electrodes E1 and the second electrodes E2 of the first light-emitting parts 111 have a rectangular shape extending in the first direction in a top view. The first electrodes E1 and the second electrodes E2 of the second light-emitting parts 112 located in the first row and the fifth row have a rectangular shape extending in the first direction in a top view. The first electrodes E1 and the second electrodes E2 of the second light-emitting parts 112 located in the second to fourth rows have a rectangular shape extending in the second direction.

In the case in which the light-emitting device 1 is used as a light source for a flash lamp of an imaging device, all the first light-emitting parts 111 may emit light, or the first light-emitting parts 111 located at the center among the first light-emitting parts 111 may emit light in the telephoto mode (first irradiation mode).

Substrate

Figure 5B:
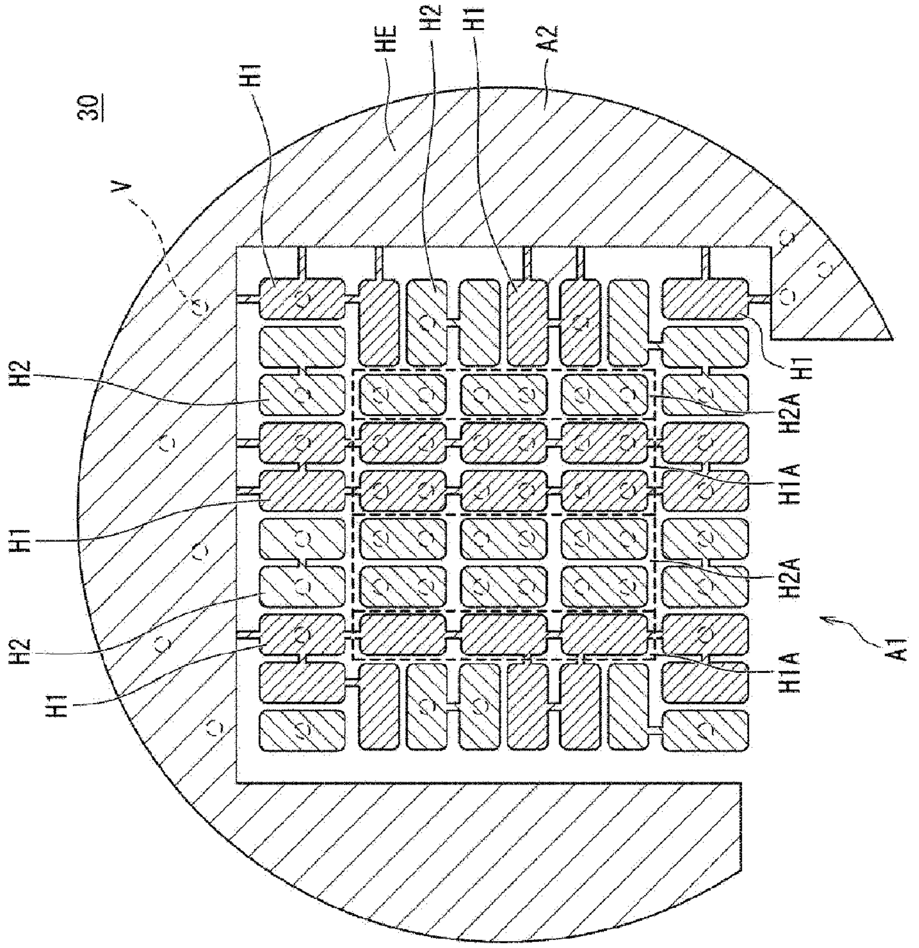
FIG. 5B is a schematic plan view of a third modification of the substrate according to the embodiment of the present disclosure.
Figure 5C:
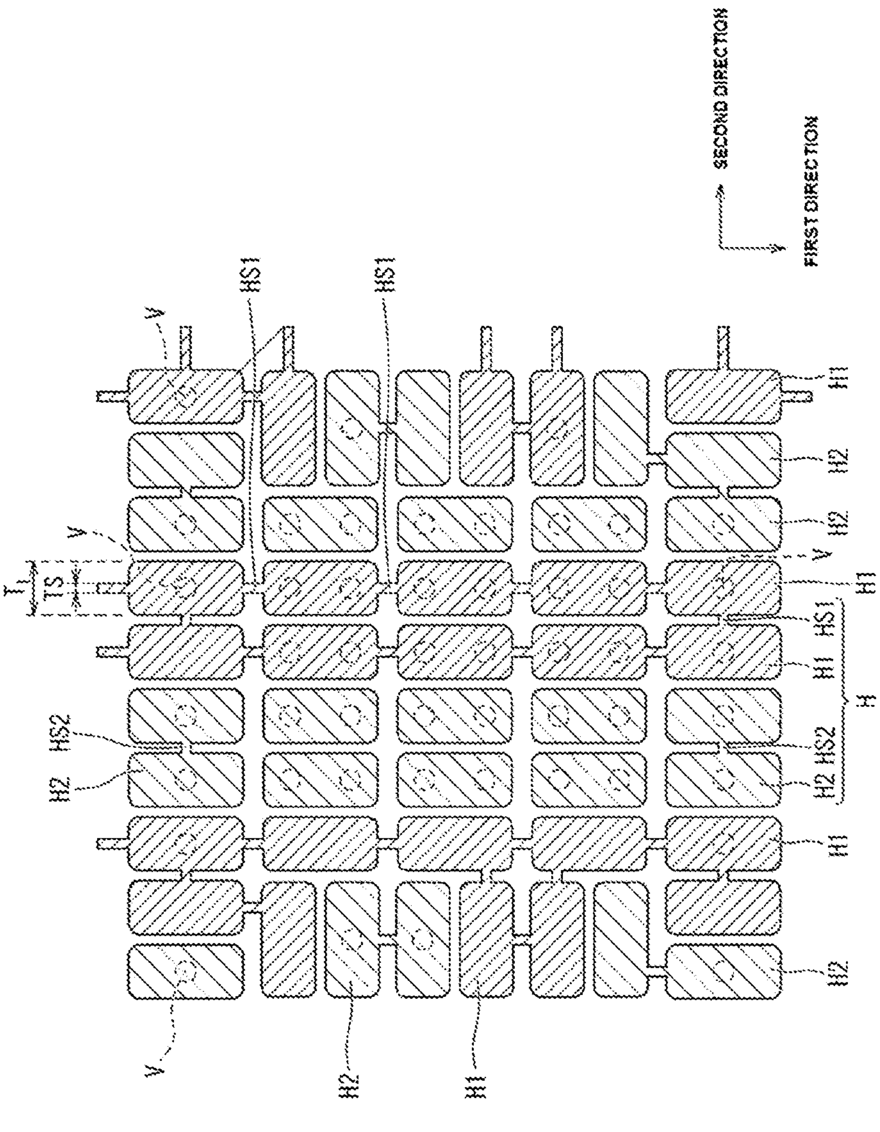
FIG. 5C is a schematic plan view of a portion of the substrate shown in FIG. 5B on which the light source is to be disposed.

The substrate 30 includes first wiring portions H1 and second wiring portions H2 on the upper surface 30U as shown in FIGS. 5B and 5C. The first wiring portions H1 are electrically connected to the first electrodes E1 of the light-emitting parts 11, and the second wiring portions H2 are electrically connected to the second electrodes E2 of the light-emitting parts 11.

The first wiring portions H1A connected to the first light-emitting parts 111 are continuous with first wiring portions connected to adjacent light-emitting parts 11 through first wiring connection portions HS1. In the case in which there are a plurality of first light-emitting parts 111, it is sufficient that the first wiring portion H1A connected to at least one first light-emitting part 111 has the above configuration. With this structure, the heat dissipation performance can be improved compared with a light-emitting device including no first wiring connection portions HS1 in which adjacent first wiring portions are separate from each other. In the present modification, the first wiring portions H1A connected to all the first light-emitting parts are continuous with respective first wiring portions connected to adjacent light-emitting parts 11 through first wiring connection portions HS1. A light-emitting device that offers good heat dissipation performance can thus be provided.

In the present modification, the width of the first wiring connection portions HS1 is smaller than the width of the first wiring portions H1. Specifically, a width TS in the second direction of a first wiring connection portion HS1 connecting first wiring portions H1 adjacent to each other in the first direction is smaller than a width T1 in the second direction of the adjacent first wiring portions H1. The width in the first direction of a first wiring connection portion HS1 connecting first wiring portions H1 adjacent to each other in the second direction is smaller than the width in the first direction of the adjacent first wiring portions H1. By causing the width of the first wiring connection portions HS1 to be smaller than the width of the first wiring portions H1, the precision of mounting of the light-emitting parts 11 can be improved when the light-emitting parts 11 are disposed on the substrate 30 using bonding members such as solder. Specifically, the bonding members such as solder have the property of flowing into or staying in a region with a broad flow path when melted with heat. Accordingly, by causing the width of the first wiring connection portions HS1 smaller than the width of the first wiring portions H1, the bonding members disposed on the first wiring portions H1 tend to stay not on the first wiring connection portions HS1 but on the first wiring portions H1 when melted with heat. The precision of mounting of the light-emitting parts 11 can thus be improved.

The substrate 30 preferably includes wirings electrically connected to a plurality of first wiring portions H1 through vias V. For example, the vias V contain electroconductive metal members that offer high heat dissipation performance. For example, the wirings electrically connected through the vias V is inner-layer wiring disposed inside the substrate 30 or lower-surface wiring disposed on the lower surface of the substrate 30. That is, a plurality of first wiring portions H1 are preferably electrically connected to the inner-layer wiring or the lower-surface wiring through the vias V. Heat generated from the light-emitting parts 11 can thus be dissipated through the vias V. It is particularly preferable to provide vias V on the first wiring portions H1 connected to the first wiring connection portions HS1. With this structure, heat generated from the light-emitting parts 11 is dissipated through the first wiring connection portions HS1 in the horizontal direction of the first wiring portions H1 and through the vias V in the height direction of the first wiring portions H1. The heat dissipation performance of the light-emitting device can thus be further improved.

Two or more first wiring portions H1 continuous with each other through the first wiring connection portion HS1 may include a first wiring portion H1 provided with a via V and a first wiring portion H1 provided with no vias V. For example, when the substrate 30 is designed, it may be impossible to provide vias V on all of a plurality of first wiring portions H1 in a small light-emitting device because of positional relationships between respective wiring patterns of the wiring portions H on the upper surface 30U, the inner-layer wiring, and the lower-surface wiring. Even in such a case, by providing vias V on only some of two or more first wiring portions H1 continuous with each other through the first wiring connection portion HS1, heat transmitted to the continuous first wiring portions H1 can be dissipated through the vias V. The second wiring portions H2 may be provided with vias V.

The upper surface 30U of the substrate 30 preferably includes a first region A1 in which the light source 10 is disposed and a second region A2 that is located outward of the first region A1 and is provided with an outer wiring portion HE as shown in FIG. 5B. The outer wiring portion HE is continuous with a plurality of first wiring portions H1. In the present modification, the outer wiring portion HE is connected to the first wiring portions H1 connected to the outermost light-emitting parts 11. With such a configuration, heat generated in the first region A1 by emission of light by the light source 10 can be released into the second region A2. The heat dissipation performance of the light-emitting device can thus be further enhanced.

In a suitable form of the outer wiring portion HE, the outer wiring portion HE may be provided with at least one via V. In such a configuration, vias V can be provided on the outer wiring portion HE broader than the first wiring portions H1. With this structure, even in the case in which the vias V cannot be provided on the first wiring portions H1, heat transmitted to the first wiring portions H1 can be dissipated through the vias V on the outer wiring portion HE by providing the vias V on the outer wiring portion HE continuous with the first wiring portions H1. With the outer wiring portion HE broader than the first wiring portions H1, the number and size of the vias V can be flexibly selected.

Second wiring portions H2 connected to at least some of the second light-emitting parts 112 may be continuous with each other through second wiring connection portions HS2. For example, in the case in which the second light-emitting parts 112 disposed on the outer side may be collectively emit light, the second wiring portions H2 connected to the second light-emitting parts 112 may be electrically connected to each other. With such a configuration, heat generated from at least some of the second light-emitting parts 112 can be dissipated through the second wiring connection portions HS2, and the heat dissipation performance of the light-emitting device can be improved.

Fourth Modification of Light-Emitting Device

Subsequently, a fourth modification of the light-emitting device according to the present disclosure will be described referring to FIG. 6 and FIG. 7. In the present modification, the form of the electrodes E of the light-emitting parts 11 is different from the forms in the embodiment and modifications described above.

Light-Emitting Part

Figure 6:
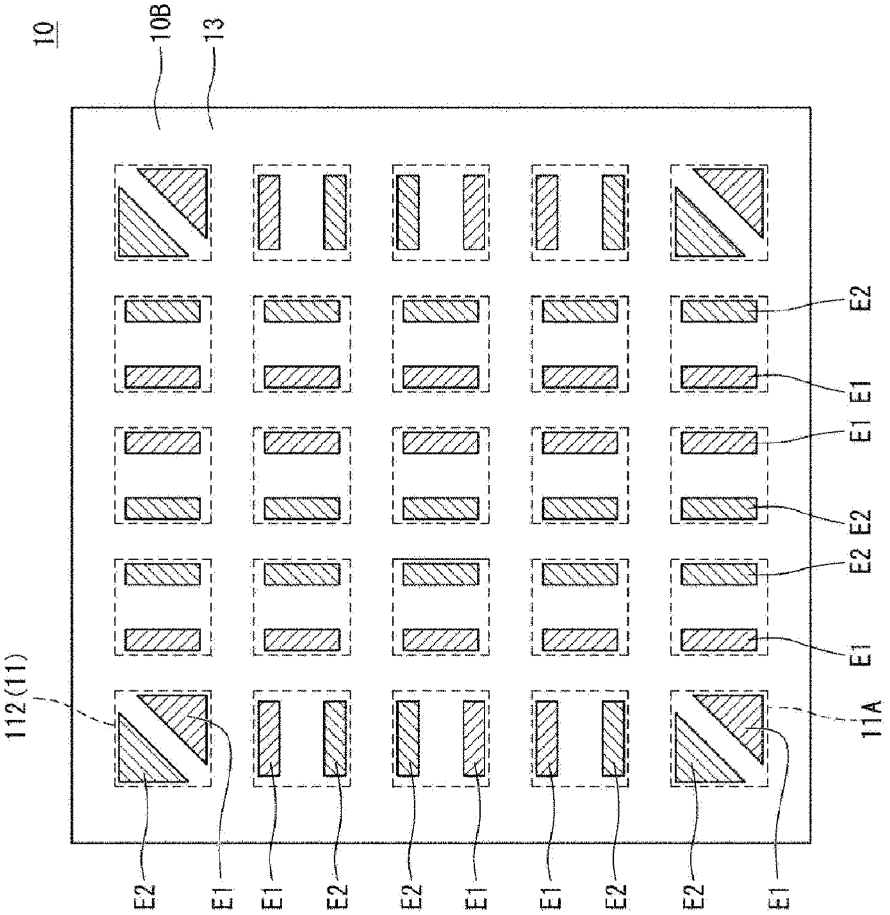
FIG. 6 is a schematic bottom view of a fourth modification of the light source according to the embodiment of the present disclosure.

In the present modification, the areas of the first electrodes E1 and the second electrodes E2 of the light-emitting parts 11 disposed at the corners among a plurality of light-emitting parts 11 are larger than the areas of the first electrodes E1 and the second electrodes E2 of the other light-emitting parts 11 as shown in FIG. 6. The shape of each of the electrodes of the light-emitting parts 11 disposed at the corners is a triangular shape extending along two sides of the outer periphery of the light-emitting part 11. In the case in which the light-emitting part 11 is small, the first electrode E1 and the second electrode E2 are required to be a predetermined distance or more away from each other so as to be surely insulated from each other and prevent migration of the bonding member bonded to each electrode. By forming the electrodes of the light-emitting parts 11 disposed at the corners into the above shape, the electrode area of each electrode can be increased while keeping the first electrode E1 and the second electrode E2 a predetermined distance or more away from each other. This structure allows the amount of the bonding members used for connection to the substrate 30 to be increased, and the fixing strength between the light-emitting parts 11 and the substrate 30 can be enhanced. The separation distance between the first electrode E1 and the second electrode E2 of each of the light-emitting parts 11 disposed at the corners is substantially equal to the separation distance between the first electrode E1 and the second electrode E2 of a light-emitting part 11 disposed at a position other than the corners. The term "substantially equal" as used in this case can include a difference of ±5%.

Figure 7:
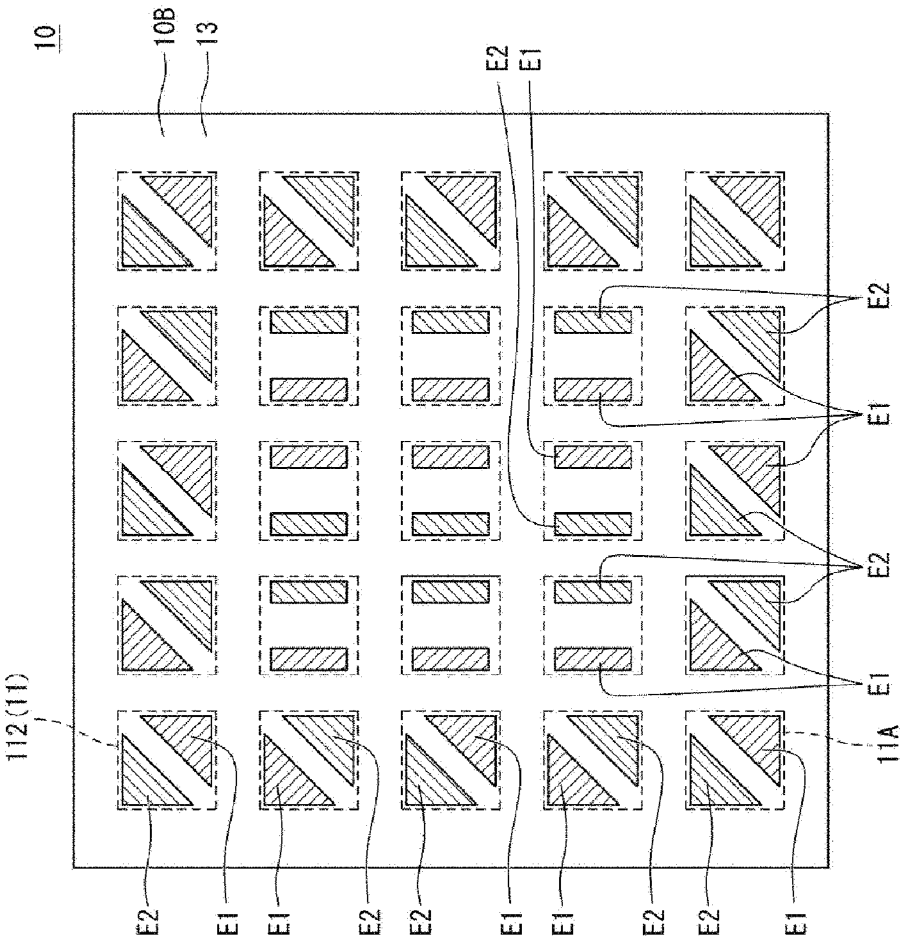
FIG. 7 is a schematic bottom view of the fourth modification of the light source according to the embodiment of the present disclosure.

Alternatively, the areas of the first electrodes E1 and the second electrodes E2 of the light-emitting parts 11 (second light-emitting parts 112) disposed on the outer side may be larger than the areas of the first electrodes E1 and the second electrodes E2 of the other light-emitting parts 11 as shown in FIG. 7.

Light-Emitting Module Employing Light-Emitting Device of Present Embodiment

Figure 8:
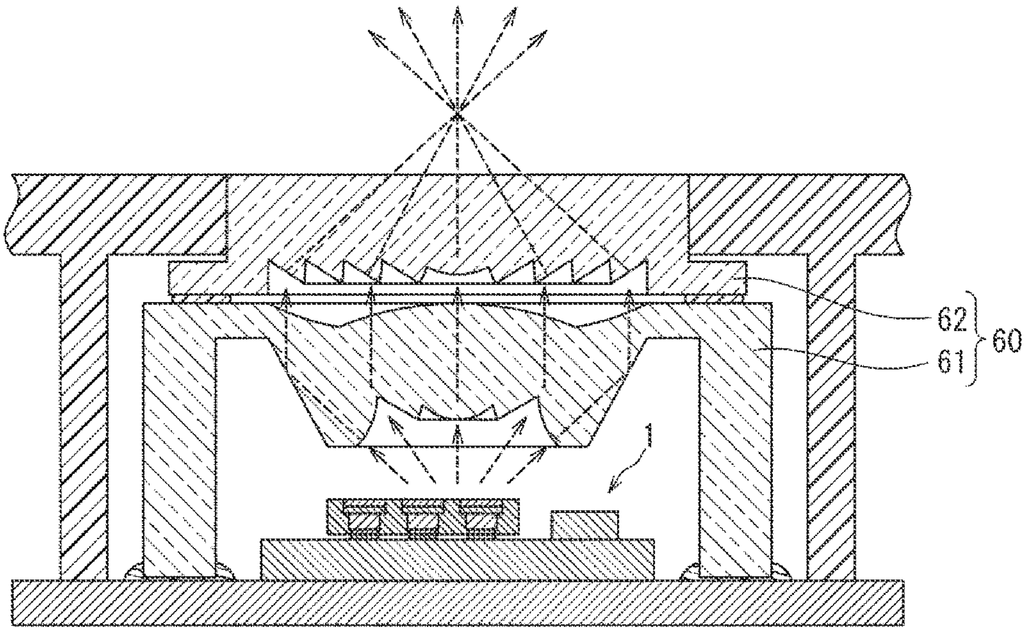
FIG. 8 is a schematic cross-sectional view of a light-emitting module employing the light-emitting device of the present disclosure.

Subsequently, a light-emitting module employing the light-emitting device according to the above embodiment will be described referring to FIG. 8. In the light-emitting module, a lens 60 is disposed above the light-emitting device 1. As an example of the lens 60, a first lens 61 may be disposed above the light-emitting device 1, and a second lens 62 may be disposed above the first lens 61. For example, the second lens 62 is a Fresnel lens. The Fresnel lens is disposed such that a lower surface having protrusions and recesses faces the light source 10 side to receive light emitted from the light source 10 and allow the light to be emitted from a flat upper surface. The thickness of the lens 60 can be reduced by using the Fresnel lens, and the light-emitting module can be miniaturized.

The modes disclosed herein are examples in all aspects and do not constitute grounds for restrictive interpretation. Accordingly, the technical scope of the present invention is not interpreted on the basis of only the modes described above, but rather is defined on the basis of the claims. The technical scope of the present invention encompasses all modifications within the meanings and ranges equivalent to the claims.

The invention claimed is:

1. A light-emitting device comprising:

a light source comprising:

a plurality of light-emitting parts, each having a first main surface serving as a light-exiting surface, and a second main surface on a side opposite the first main surface, and each comprising a first electrode and a second electrode at the second main surface, and a covering member integrally holding the plurality of light-emitting parts such that the first electrode and the second electrode are exposed from the covering member, wherein:

the plurality of light-emitting parts are configured to be turned on individually or as a group and are arranged in a first direction and a second direction intersecting the first direction; and a substrate having an upper surface and comprising, at the upper surface:

a plurality of first wiring portions, each of which is opposed to a corresponding one of the first electrodes of the light-emitting parts, and a plurality of second wiring portions, each of which is opposed to a corresponding one of the second electrodes of the light-emitting parts; wherein:

the plurality of light-emitting parts comprise a plurality of first light-emitting parts disposed at a center area in a top view, and one or more second light-emitting parts disposed outward of the plurality of first light-emitting parts in a top view, the plurality of light-emitting parts are operable in a first irradiation mode in which only the plurality of first light-emitting parts emit light at a predetermined output, and one of the first wiring portions connected to one of the plurality of first light-emitting parts is continuous through a first wiring connection portion with two or more first wiring portions connected to two or more other ones of the plurality of first light-emitting parts.

2. The light-emitting device according to claim 1, wherein all of the plurality of first wiring portions are continuous with each other through the first wiring connection portion.

3. The light-emitting device according to claim 1, wherein a width in the second direction of the first wiring connection portion connecting adjacent ones of the first wiring portions in the first direction is smaller than a width in the second direction of the adjacent first wiring portions.

4. The light-emitting device according to claim 1, wherein the substrate comprises wirings electrically connected to the plurality of first wiring portions through a via.

5. The light-emitting device according to claim 4, wherein two or more of the first wiring portions continuous with each other through the first wiring connection portion comprise a first wiring portion comprising the via and a first wiring portion not comprising the via.

6. The light-emitting device according to claim 1, wherein:

the upper surface of the substrate comprises a first region on which the light source is located, and a second region located outward of the first region and comprising an outer wiring portion, and the outer wiring portion is continuous with the plurality of first wiring portions.

7. The light-emitting device according to claim 6, wherein the outer wiring portion comprises at least one via.

8. The light-emitting device according to claim 1, wherein areas of the first electrode and the second electrode of one of the light-emitting parts disposed at a corner among the plurality of light-emitting parts are larger than areas of the first electrode and the second electrode of another one of the light-emitting parts.

9. The light-emitting device according to claim 1, wherein at least two of the plurality of second wiring portions connected to second light-emitting parts are continuous with each other through a second wiring connection portion.

10. A flash lamp comprising:

the light-emitting device according to claim 1, wherein:

the first irradiation mode corresponds to a telephoto mode.

11. The flash lamp according to claim 10, wherein:

the plurality of light-emitting parts are operable in a second irradiation mode in which the plurality of first light-emitting parts and the one or more second light-emitting parts collectively emit light, and the second irradiation mode corresponds to a wide-angle shooting mode.

12. A light-emitting device comprising:

a light source comprising:

a plurality of light-emitting parts, each having a first main surface serving as a light-exiting surface, and a second main surface on a side opposite the first main surface, and each comprising a first electrode and a second electrode at the second main surface, and a covering member integrally holding the plurality of light-emitting parts such that the first electrode and the second electrode are exposed from the covering member, wherein:

the plurality of light-emitting parts are configured to be turned on individually or as a group and are arranged in a first direction and a second direction intersecting the first direction; and a substrate having an upper surface and comprising, at the upper surface:

a plurality of first wiring portions, each of which is opposed to a corresponding one of the first electrodes of the light-emitting parts, and a plurality of second wiring portions, each of which is opposed to a corresponding one of the second electrodes of the light-emitting parts; wherein:

the plurality of light-emitting parts comprise one or more first light-emitting parts disposed at a center area in a top view, and a plurality of second light-emitting parts disposed outward of the one or more first light-emitting parts in a top view, the plurality of light-emitting parts are operable in a first irradiation mode in which only the one or more first light-emitting parts emit light at a predetermined output, and one of the first wiring portions connected to one of the one or more first light-emitting part is continuous through a first wiring connection portion with two or more of the first wiring portions connected to two or more of the second light-emitting parts that are adjacent to said one of the one or more first light-emitting parts.

13. The light-emitting device according to claim 12, wherein all of the plurality of first wiring portions are continuous with each other through the first wiring connection portion.

14. The light-emitting device according to claim 12, wherein a width in the second direction of the first wiring connection portion connecting adjacent ones of the first wiring portions in the first direction is smaller than a width in the second direction of the adjacent first wiring portions.

15. The light-emitting device according to claim 12, wherein the substrate comprises wirings electrically connected to the plurality of first wiring portions through a via.

16. The light-emitting device according to claim 15, wherein two or more of the first wiring portions continuous with each other through the first wiring connection portion comprise a first wiring portion comprising the via and a first wiring portion not comprising the via.

17. The light-emitting device according to claim 12, wherein:

the upper surface of the substrate comprises a first region on which the light source is located, and a second region located outward of the first region and comprising an outer wiring portion, and the outer wiring portion is continuous with the plurality of first wiring portions.

18. The light-emitting device according to claim 17, wherein the outer wiring portion comprises at least one via.

19. The light-emitting device according to claim 12, wherein areas of the first electrode and the second electrode of one of the light-emitting parts disposed at a corner among the plurality of light-emitting parts are larger than areas of the first electrode and the second electrode of another one of the light-emitting parts.

20. The light-emitting device according to claim 12, wherein at least two of the plurality of second wiring portions connected to second light-emitting parts are continuous with each other through a second wiring connection portion.

21. A flash lamp comprising:

the light-emitting device according to claim 13, wherein:

the first irradiation mode corresponds to a telephoto mode.

22. The flash lamp according to claim 21, wherein:

the plurality of light-emitting parts are operable in a second irradiation mode in which the one or more first light-emitting parts and the plurality of second light-emitting parts collectively emit light, and the second irradiation mode corresponds to a wide-angle shooting mode.

23. A light-emitting device comprising:

a light source comprising:

a plurality of light-emitting parts, each having a first main surface serving as a light-exiting surface, and a second main surface on a side opposite the first main surface, and each comprising a first electrode and a second electrode at the second main surface, and a covering member integrally holding the plurality of light-emitting parts such that the first electrode and the second electrode are exposed from the covering member, wherein:

the plurality of light-emitting parts are configured to be turned on individually or as a group and are arranged in a first direction and a second direction intersecting the first direction; and a substrate having an upper surface and comprising, at the upper surface:

a plurality of first wiring portions, each of which is opposed to a corresponding one of the first electrodes of the light-emitting parts, and a plurality of second wiring portions, each of which is opposed to a corresponding one of the second electrodes of the light-emitting parts; wherein:

the plurality of light-emitting parts comprise one or more first light-emitting parts disposed at a center area in a top view, and one or more second light-emitting parts disposed outward of the one or more first light-emitting parts in a top view, the plurality of light-emitting parts are operable in a first irradiation mode in which only the one or more first light-emitting parts emit light at a predetermined output, one of the first wiring portions connected to one of the one or more first light-emitting parts is continuous through a first wiring connection portion with (i) one of the first wiring portions connected to another one of the one or more first light-emitting parts or (ii) one of the first wiring portions connected to a second light-emitting part adjacent to said one of the one or more first light-emitting parts, and at least two of the plurality of second wiring portions connected to second light-emitting parts are continuous with each other through a second wiring connection portion.

* * * * *